United States Patent [19]

Sumi

[11] 4,151,421
[45] Apr. 24, 1979

[54] METHOD FOR COMPRESSING PATTERN DATA AND DATA COMPRESSION PROCESSING CIRCUIT FOR RADIANT BEAM EXPOSURE APPARATUSES

[75] Inventor: Masahiko Sumi, Yokohama, Japan

[73] Assignee: Vlsi Technology Research Association, Japan

[21] Appl. No.: 873,890

[22] Filed: Jan. 31, 1978

[30] Foreign Application Priority Data

Jan. 31, 1977 [JP] Japan ............................. 52-8805

[51] Int. Cl.$^2$ ............................................. A61K 27/02
[52] U.S. Cl. .............................. 250/492 A; 250/492 R
[58] Field of Search ......................... 250/492 A, 492 R

[56] References Cited

U.S. PATENT DOCUMENTS 3,900,737   8/1975   Collier et al. .................... 250/492 A Primary Examiner—Harold A. Dixon
Attorney, Agent, or Firm—Finnegan, Henderson, Farabow & Garrett

[57] ABSTRACT

The data corresponding to an IC pattern to be depicted on a semiconductor pellet are compressed and stored in a memory. A plurality of pattern data trains with the same content are compressed into a single pattern data train. A code representing the number of the same patterns is added to the head of the single pattern data train. The data element continuously included in the single pattern data train are encoded into another code for data compression. In this coding, the binary "0" is disposed with the same number as the result of subtraction of 2 from the quotient of n (number of the continuous data elements having the same binary value)/2. Following a series of binary "0"s, the binary "1" is disposed for partition. After the partitive binary "1", the binary "0" or "1" is disposed for indicating odd or even number of the data elements. The binary "1" or "0" is inserted between the code for representing the number of the same line patterns and the compressed single pattern data train. The binary inserted is used for correctly coupling adjacent divided patterns together.

9 Claims, 18 Drawing Figures

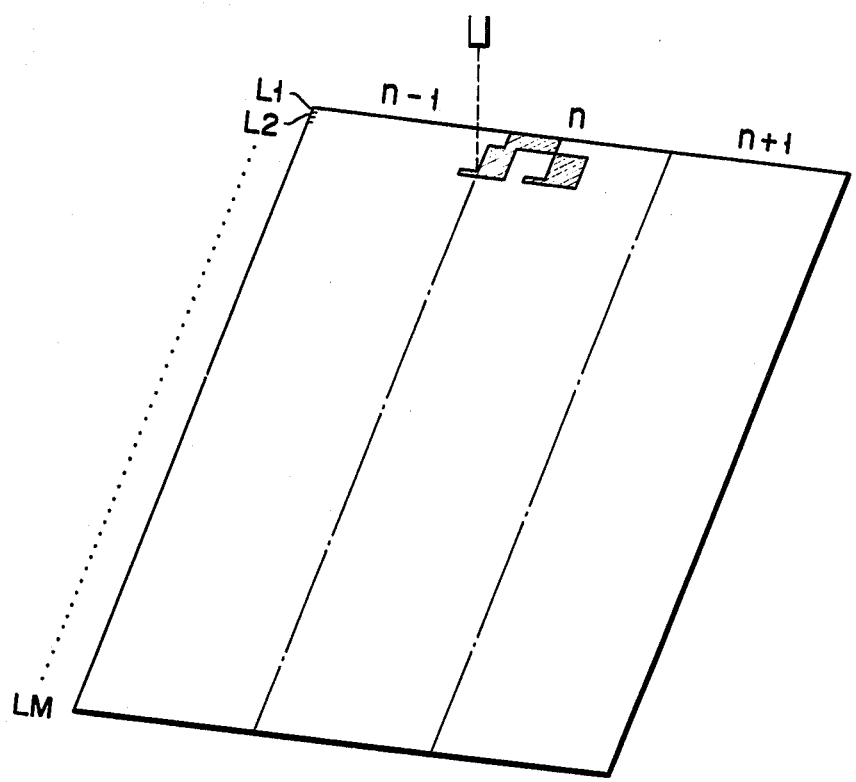

FIG. 3
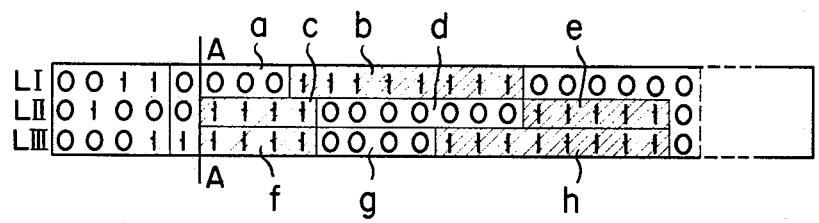
FIG. 4
| LENGTH OF BLACK OR WHITE | LENGTH OF BLACK OR WHITE AT THE LEAD OF LINE | CODE |
|---|---|---|
| 4 | 0 | 1 1 |
| 5 | 1 | 1 0 |
| 6 | 2 | 0 1 1 |
| 7 | 3 | 0 1 0 |
| 8 | 4 | 0 0 1 1 |
| ⋮ | ⋮ | ⋮ |
| $2n$ | $2n-4$ | 0 0 0 0 0 1 1 ($n-2$) |
| $2n+1$ | $2n-3$ | 0 0 0 0 0 0 1 ($n-2$) |
FIG. 5
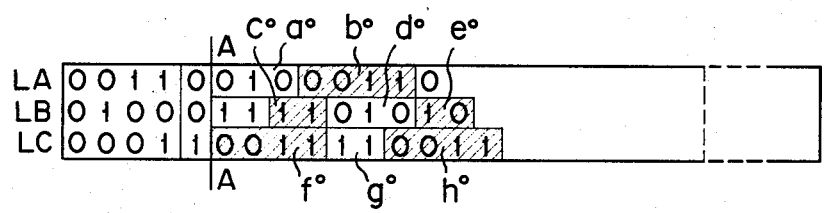

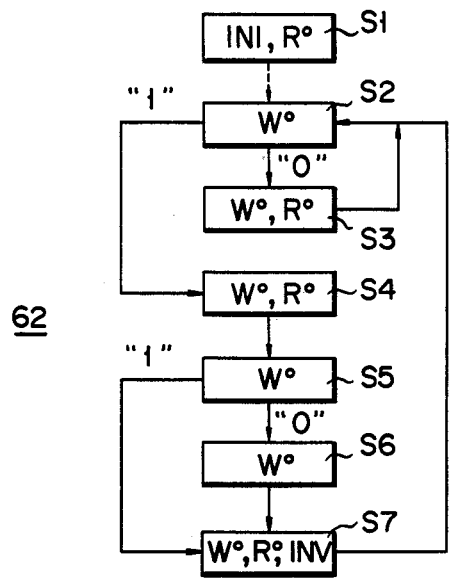
F I G. 10
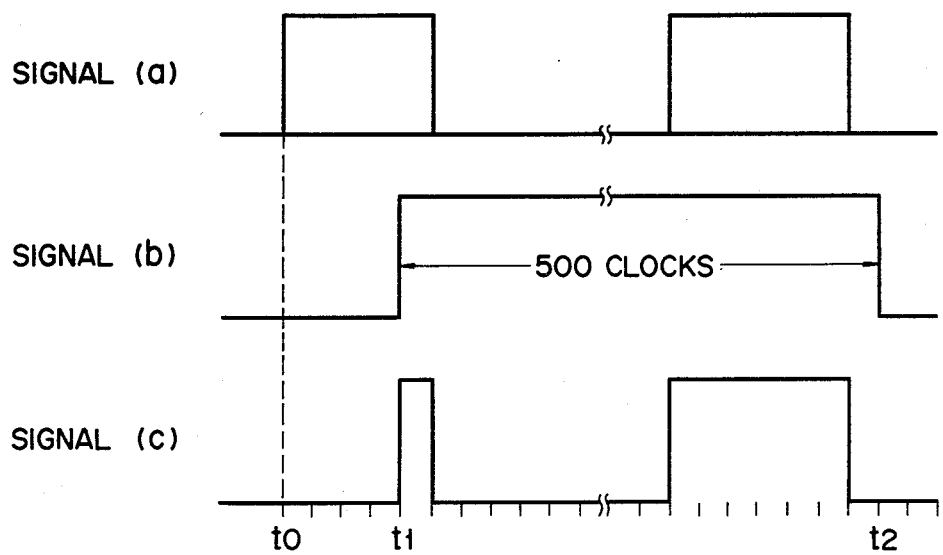
F I G. 11

METHOD FOR COMPRESSING PATTERN DATA AND DATA COMPRESSION PROCESSING CIRCUIT FOR RADIANT BEAM EXPOSURE APPARATUSES

BACKGROUND OF THE INVENTION

The present invention relates to a radiant beam exposure apparatus of a raster scan system and, more particularly, a method for compressing pattern data and a pattern data compression processing circuit, for the radiant beam exposure apparatus.

The prior art and its defects will first be briefed. The description will proceed by using an electron beam; however, it is applicable for charged beams such as X-rays. An electron beam exposure system is generally classified into a one-stroke type and a projection type. The one-stroke type is further divided into a vector scanning system and a raster scan system. In the raster scan system, a pattern is divided in a mesh-like fashion, and black meshes are each represented by "1" and white meshes each by "0". To depict a part of an IC pellet 250 $\mu$m × 5000 $\mu$m with the mesh pitch 0.5$\mu$m, the picture elements are $$250/0.5 \times 5000/0.5 = 500 \times 10^4 = 5 \times 10^6.$$

Accordingly, the memory must have at least 5M bits memory capacity for storing the picture elements of 5 × $10^6$. The memory cycle of the present minicomputer is at most 800 nano sec. For the parallel processing of 16 bits, 50 nano sec/bit is the upper limit of the data transfer rate. Incidentally, the data transfer rate corresponds to 20M bits/sec.

With progress of the IC technology, the electron beam exposure system with little diffraction has attracted attention. Nevertheless, it has been not yet put to practical use in the industrial field. The most important reason for this is that the length of the exposure time is too long. For example, when an IC pattern is depicted on a wafer of 10 cm² by using an electron beam of 0.5 $\mu$m, it takes 2000 seconds under a condition that the data transfer time is 50 nano sec/bit and the time for overhead is negligible. To practically use the electron beam exposure apparatus in the industrial field, the exposure time must be below about 300 seconds.

In the light of development of electronic computers of late years, it is very difficult to improve the pattern depicting speed by about one digit in several years for large capacitive memory 1 to 10M bits, particularly from a cost point of view.

SUMMARY OF THE INVENTION

Accordingly, an object of the present invention is to provide a pattern data compression processing circuit for radiant beam exposure apparatus by which the data transfer speed is remarkably improved and thus the pattern depicting speed is fully fit for practical use.

In the present invention, the IC pattern is analized and its peculiar pattern feature is used. A single memory bit is assigned to several mesh-points, i.e. picture elements, on the pattern, although, by convention, the correspondence between the mesh-points and bits in the memory is 1:1. A high speed buffer memory associated with a decoder is combined with a large capacitive memory. As a result, a memory with a large capacity and at high speed is realized. A pattern depicting rate of 160 M bits/sec is attained.

These and other objects of the present invention will become more apparent in the detailed description and an embodiment, taken in connection with the accompanying drawings, in which:

BRIEF DESCRIPTION OF THE DRAWING

FIG. 1 illustrates how to depict an IC pattern on a pellet;

FIG. 2 shows a bit pattern of a part of the IC pattern in FIG. 1;

FIG. 3 shows a bit pattern that is formed by compressing the bit pattern shown in FIG. 2 in the vertical direction;

FIG. 4 shows a table for explaining how to compress the bit pattern in FIG. 3 in the horizontal direction;

FIG. 5 shows a bit pattern formed in accordance with the table in FIG. 4;

FIG. 10 shows a flow chart for illustrating the operation of the decoder in FIG. 9;

FIG. 11 shows a set of wave forms of a gate signal and an output signal of the flip-flop shown in FIG. 9;

DESCRIPTION OF THE PREFERRED EMBODIMENT

Figure 6:
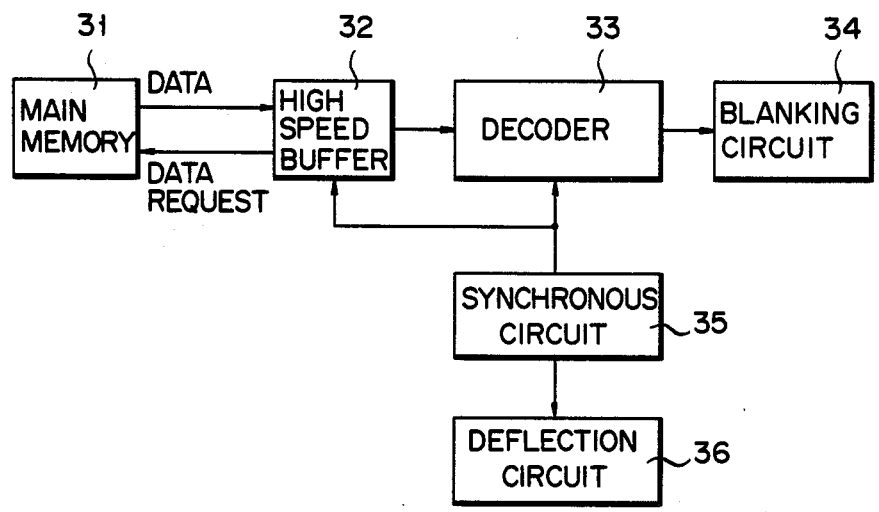
FIG. 6 shows a block diagram of a circuit for processing the compressed pattern data.

Referring now to FIG. 1, there is shown an IC pattern having three frames vertically partitioned (n−1), n and (n+1) and a number of lines horizontally arranged Ll to Lm. In the figure, an electron beam is assumed to scan across a silicon pellet 11. The details of a part of the IC pattern in FIG. 1 is illustrated in FIG. 2 in the form of a plurality of pattern data trains each constituted by a series of bits. As shown, the bit patterns in the lines L1 to L3 are identical and these in the lines L4 to L7 also are identical. The study of the IC pattern shows that identical pattern portions successively continue for approximately four or more lines.

In FIG. 2, the nth frame is found on the right side with respect to a line A—A' and the end portion of the (n−1) frame is disposed on the left side. The (N+1)th frame is omitted. The bit pattern constituted by a plurality of bit trans as shown in FIG. 2 takes a long time for data-transfer.

The bit pattern shown in FIG. 3 results from compression of the bit patterns in FIG. 2 in vertical direction. As seen from FIG. 3, identical bit trains having the same pattern are gathered into a single bit train headed by four bits representing the number of bit trains with the same pattern. The first to three bit trains i.e. lines L1 to L3 are compressed as shown in a line LI in FIG. 3. In the line LI, four bits "0011" are disposed on the head, followed by "0" and "00011111111000000". Similarly, the bit pattern represented by L4 to L7 takes a bit pattern shown in a line LII with "0100" at the head. These first four bits "0011" and "0100" indicate three lines and four lines of identical patterns, respectively. As seen from FIG. 3, the pattern data trains in FIG. 2 are considerably reduced in the vertical direction. The meaning of a single bit following the first four bit will be referred to in detail later.

The unitary quantity "minimum line width" may be used to represent the minuteness of ICs. For example, when the minimum line width is 2μm, the intervals between adjacent lines must be each 2μm or more. The size of the line succeeding to the 2μm is in the order of 2.5μm and not 4μm. In other words, the minimum line width, i.e. 2μm, is approximately about four times the minimum increment, i.e. 0.5μm, of the line width. The invention uses this feature of the IC pattern for reducing the bits of each line in the horizontal direction.

FIG. 4 shows codes for performing such the bit reduction. In this example, a code "11" is assigned to the length, 2μm, which is four times of the mesh interval, 0.5μm. Another code "10" is used to represent the length 2.5μm, which is five times of the mesh interval. In the coding, binary "0"s are arranged with the same number as the result of subtraction of 2 from the quotient of n/2, where n is the number of continuous bits having the same binary value. Following the last binary "0", a binary "1" is disposed for partition. After the partitive binary "1", the binary "1" or "0" is disposed for indicating odd or even number of continuous bits corresponding to white or black picture elements. The binary "1" is used when the remainder of the n/2 is 0. The binary "0" is assigned to 1 of the remainder. In above description, the continuous bits having the same binary value are more than four. When the continuous bits of the same binary value are less than four, the corresponding number shown in the second column of the FIG. 4 table is used.

FIG. 5 shows bit patterns formed by coding the bit patterns in FIG. 3 in accordance with the rule of the table in FIG. 4. In FIGS. 5 and 3, characters LA, LB and LC correspond to LI, LII and LIII and a to h correspond to a° to h°, respectively.

Let us code the first bit train LI in FIG. 3 in accordance with the table in FIG. 4. A bit group or bit section a of the first bit train LI includes three continuous bits indicating "000". The table in FIG. 4 designates 3 in the middle column and the code 010 in the right column. The code 010 is located in a section a° in FIG. 5. A section b in FIG. 3 includes eight "1" bits successively arranged. Therefore, the table designates 8 in the left column and the corresponding code "0011" in the right column. The code "0011" is located in a corresponding section b° in FIG. 5.

In the bit train LII, the 5th bit is "0" and the 6th bit indicates "1". In this case, the 5th and 6th bits of the bit train LB are indicated as "11" which represents inversion of the image of the pattern i.e. change from a white image to a black image. The 7th and 8th bits are indicated as "11" representing a black image. That is, a code "1111" is given to the bit train LB in FIG. 5 as a code corresponding to the bit section C of the bit train LII in FIG. 3.

In the bit train LIII in FIG. 3, the bit preceeding to the top bit of the bit section f, i.e. the 5th bit indicates "1", the bit section f, therefore, is coded as "0011" in the right column corresponding to "4" in the middle column. Accordingly, the code "0011" is placed in the section f° of the bit train LC in FIG. 5.

As described above, the bit trains LI, LII, LIII shown in FIG. 3 are coded as shown as LA, LB, LC in FIG. 5. The 5th bits in FIGS. 3 and 5 represent data corresponding to joining portions for joining the pattern section n-1 to the pattern section n. The joining portion will be described later. By the above coding manner, 1/4 (vertical data compression rate) × ¼(horizontal data compression rate), that is, ⅛ data compression rate is obtained.

Figure 7:
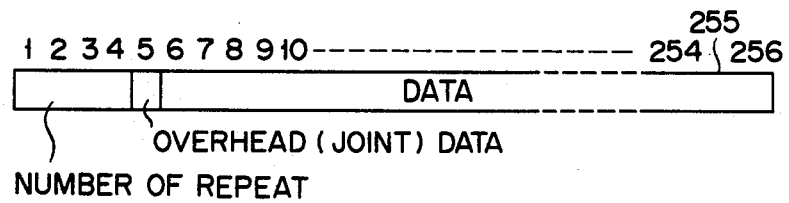
FIG. 7 shows a format representing the bit pattern of one line.

In FIG. 6, a main memory 31 has a memory capacity of 224K bytes and divided into a plurality of data blocks each having 32 bytes. The format of each block is shown in FIG. 7. A series of 16 bits are transferred sixteen times.

In FIG. 7 illlustrating the format, four bits disposed at the head of the format represent the number of repetitive data. The 5th bit represents the joint condition between adjacent frames or pattern sections, which will subsequently be described. The 6th and succeeding bits represent the length of data.

Referring again to FIG. 6, a high speed buffer 32 has a capacity of 32 data blocks i.e., 32 bytes × 32, and its memory cycle is 200 nano sec which is ¼ times of that of the main memory 31. That is, one cycle of writing and reading operation is permitted for 200 nano sec. In average, data is read out four times or more from the buffer 32 to the decoder 33 when data from the main memory is loaded one time into the buffer 32. In the decoder 33, the contents of one scanning line of 256 bits are decoded and expanded to 500 bits. The output of the decoder 33 is fed to the blanking circuit 34. The feeding to the blanking circuit 34 is performed in synchronism with an output signal from a synchronous circuit 35. The output signal is also applied to the deflection circuit 36. Therefore, the blanking circuit 34 and the deflection circuit 36 are synchronized in operation to enable depiction of a correct pattern.

Figure 8:
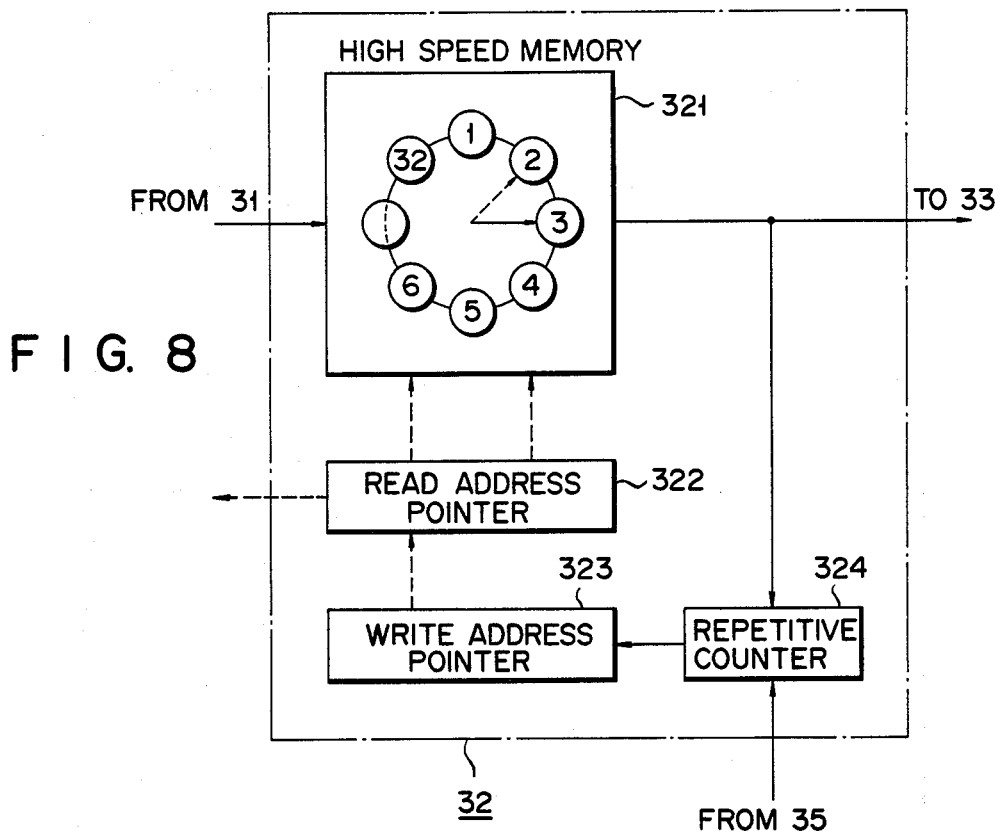
FIG. 8 shows a block diagram of a high speed buffer in FIG. 6.

Turning now to FIG. 8, there is shown the details of the high speed buffer 32. In the figure, the high speed buffer 32 includes a high speed memory 321, a write address pointer 322, a read address pointer 323 and a repititive counter 324. In the high speed memory 321, 32 address blocks are included which are arranged in a circular fashion, as shown. The data from the main memory 31 is loaded into the address block specified by the write address pointer 322. The contents stored in the memory location of the address block specified by the read address pointer 323 are read out into the decoder 33. In addressing operation, the write address pointer 322 operates in a manner that it approaches the read address pointer 323 so long as the former does not catch up and pass the latter. For example, in FIG. 8, the contents of the write address pointer 322 is "second address block" and that of the read address pointer "third address block". It appears that the changing speed of the contents of the read address pointer 323 becomes four times that of the write address pointer 322. However, the changing speed of the write address pointer 322 is large in average so that the buffer 32 can not fail to maintain its function of buffer.

At the initial stage, the four bits on the head of the FIG. 7 format are held in the repetitive counter 324. The contents, or the four bits, of the counter 324 is reduced by one bit each time that the data corresponding to one bit train (256 bits) are read out from the high speed memory in response to the trigger signal from the synchronizing circuit 35. With this reducing operation, the counter 324 becomes empty. At this time, the read address pointer 323 is advanced by one. As described above, the number of the data repitition is 4 or more in average. Therefore, the data inputting rate of the buffer 32 may be ¼ of the data outputting rate. When viewed from the decoder 33 side, the main memory 31 apparently feeds data at four times rate.

Figure 9:
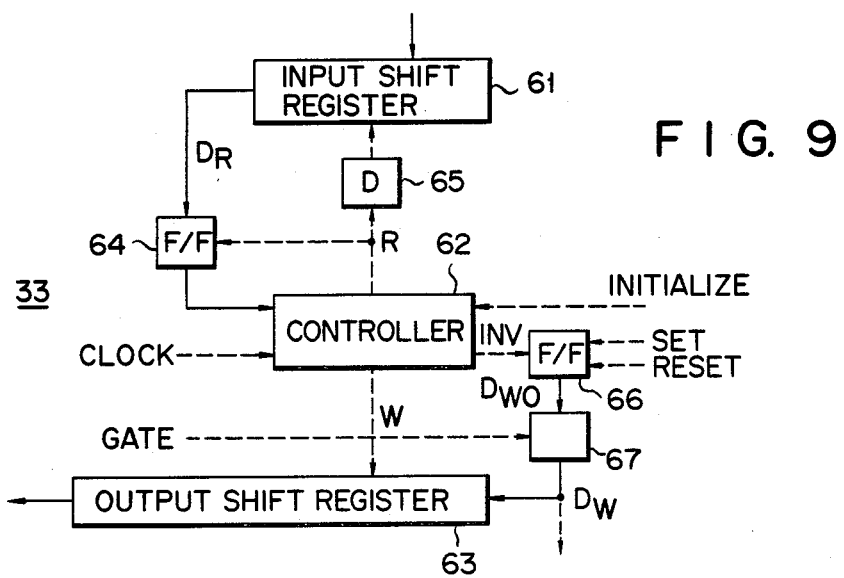
FIG. 9 shows a block diagram of a decoder in FIG. 9.

The details of the decoder circuit 33 will be given with reference to FIG. 9. Assume now that data of 256 bits are stored in an input shift register 61, and that the stored data take the format as shown in FIG. 7. It will be understood that, instead of such a long shift register, a combination of a short shift register and a RAM may be used. The contents of the input shift register 61 is read out in response to a read signal R from a controller 62 to be transferred to the controller 62 through a D type flip-flop 64. In the reading operation, the 6th bit and its succeeding ones of the stored data are successively read out one by one. The date read-out are decoded in the controller 62 and the decoded ones in turn drive a T-type flip-flop 66 to change its state from "1" to "0" or "0" to "1". The output Dwo of the flip-flop 66 is applied to an output shift-register 63, via an output setting gate circuit 67. In the output shift register 63, the original bit pattern i.e., the bit train before encoded as shown in FIG. 2, is reproduced. The output shift register 63 may be omitted. In this case, the output Dw of the output setting gate circuit 67 is directly applied to the blanking circuit 34. The flip-flop 64 is of a D type and operates to latch the contents DR of the input shift register 61 in preparation for being loaded into the controller 62. The flip-flop 64 operates responsive to the read signal R from the controller 62. A delay circuit 65 delays the read signal R delivered from the controller 62 to produce shift signal for shifting the contents of the input shift register 61. The flip-flop 66 which is operable responsive to the output signal INV from the controller 62, is SET when the 5th bit of the bit train shown in FIG. 7 is "1" and is RESET when it is "0". As previously briefed and will be detailed later, the 5th bit is used to indicate the condition of the joint between adjacent pattern frames, for example, frames n-1 and n. Accordingly, the flip-flop 67 specifies whether, the initial part of a pattern line to be scanned is black or white. The further details will be referred to later.

As described in FIG. 4, the horizontal length of the black or white part of the pattern is set up above four picture elements. However, there is a possibility that the length is 3 picture elements or less at the initial part of the line pattern, owing to the continuation of its preceeding frame pattern. Such an exceptional case is successfully processed by the output setting gate circuit 67. That is, the initial four bits are forcibly masked by using a gate signal. It is to be noted that the masking operation is effected by the gate circuit 67. The details of this method will be described later.

The sequential operation of the controller 62 is illustrated in FIG. 10. In the figure, R°, W° and INV° are used corresponding to R, W and INV in FIG. 9. The R° means that the pattern data is read out from the input shift register 61. The W° indicates to shift the output shift register 63 by one bit. The INV° is used to indicate that the T-type flip-flop 66 is operated to invert the value to be loaded into the shift register 63 between "1" and "0". INI initializes the picturing operation of one scanning line. "1" and "0" shown in FIG. 10 indicate that the operation of the controller 62 branches depending on the content DR of the input shift register 61. The respective operations are performed in synchronism with a clock signal of 160 MHz.

The operation of the decoder circuit 33 will be described with reference to FIGS. 9 and 10. In a step S1 an initial signal INI is applied to the controller 62. Upon receipt of the initial signal, the controller 62 issues a read signal R which in turn is applied to the input shift register 61, via the delay circuit 65. The delay circuit 65 delays the initial signal by one bit. In response to the read signal R, the first bit in the shift register 61 e.g. the 6th bit in the bit train LA in FIG. 5, is read out from the input shift register 61. The read out bit is then applied to the controller 62 through the D-type flip-flop 64. Upon receipt of the bit, the controller 62 produces a shift signal W (see S2). The shift signal produced goes to the output shift register 63 to shift the register 63 by one bit. As shown in FIG. 5, the 6th bit is "0". This causes the controller 62 to produce another shift signal W and another read signal R (see S3). The shift signal W produced again shifts the output shift register 63 by one bit. The read signal R produced again reads out the 7th bit from the flip-flop 61. The 7th bit is applied to the controller 62, through the flip-flop 64. The 7th bit causes the controller to produce the 3rd shift signal W which in turn shifts by one bit the output shift register 63. As shown in FIG. 5, the 7th bit is "1" and therefore the flow in FIG. 10 branches off, as shown. As a result, the controller 62 produces the 4th shift signal W and a read signal R (see S4). These signals shift the input and output registers 61 and 63 by one bit, respectively. The 3rd bit of "0" is read out from the input register 61. The 3rd bit causes the controller 62 to produce the 5th shift signal which in turn shifts the output shift register 63 by one bit (see S5). Since the 3rd bit is "0", the controller 62 produces the 6th shift signal W which shifts the output shift register 63 by one bit (see S6). After the 6th shift signal is produced, the controller 62 produces the 7th shift signal and at the same time a read signal R and an inverting signal INV (see S7). The 7th shift signal executes the 7th shift operation of the output shift register 63. In this manner, the output shift register 63 is shifted by 7 bits in response to the shift signals.

The three bits in the section a° in FIG. 5 represent the head pattern data. The first four bits within the above 7 bits must be masked. The masking operation will be given below with reference to FIGS. 9 and 11. A signal a from the flip-flop 66 and a gate signal b are applied to the gate circuit 67 where these signals are gated to produce a signal c. The signal c is applied to the output shift register 63. As shown in FIG. 11, the gate signal b is applied at t1, i.e. after four clocks, and continues for 500 clocks, i.e. till t2. That is, the writing operation into the shift register 63 is performed for 500 clocks, i.e. the time period from t1 to t2. Therefore, the first four bits during the time period from t0 to t1, are masked. Thus, the contents of the section a°, "010", is loaded as "000" into the output shift register 63.

After the section a° is decoded, the input shift register 61 feeds the first bit, "0", of the section b°, i.e. the 9th bit in FIG. 5, to the controller 63, in response to the read signal R. Upon receipt of the 9th bit, the controller 62 produces an inverting signal INV. The inverting signal INV causes the flip-flop 66 to produce "1". The "1" signal goes to shift register 63 through the gate 67. As described above, and illustrated in FIG. 10, when the bit delivered from the input shift register 61 is "0", the controller 62 produces two shift signals W. The two shift signals enable two "1" level signals from the T-flip-flop 66 loaded into the output shift register 63. When the next bit "0" is read out from the input shift register 61, the output shift register 63 is shifted again by two bits in response to the two shift signals W. That is, two "1" level signals are loaded into the output shift register 63. As will be recalled, the section b° is "0011". When the third bit "1" of the section b° is read out, two "1" signals are additionally loaded into the output shift register 63. Further, when the fourth bit "1" is read out, the "1" signal is loaded into the register 62 at the S5 and S7 steps. In this way, eight "1" level signals are loaded into the output shift register 63. In other words, the code "0011" in the section b° is decoded into "11111111".

The similar operation will be repeated for the remaining bit sections of the bit train LA in FIG. 5, with the result that the encoded bit train LA is decoded into the bit train LI. The decoded bit train in the output shift register 63 is applied to the blanking circuit 34 (FIG. 1) and then is used to depict the pattern on the IC pellet. A preferable depicting manner is disclosed in allowed U.S. Patent application Ser. No. 675,179 now U.S. Pat. No. 4,060,269.

Figure 12:
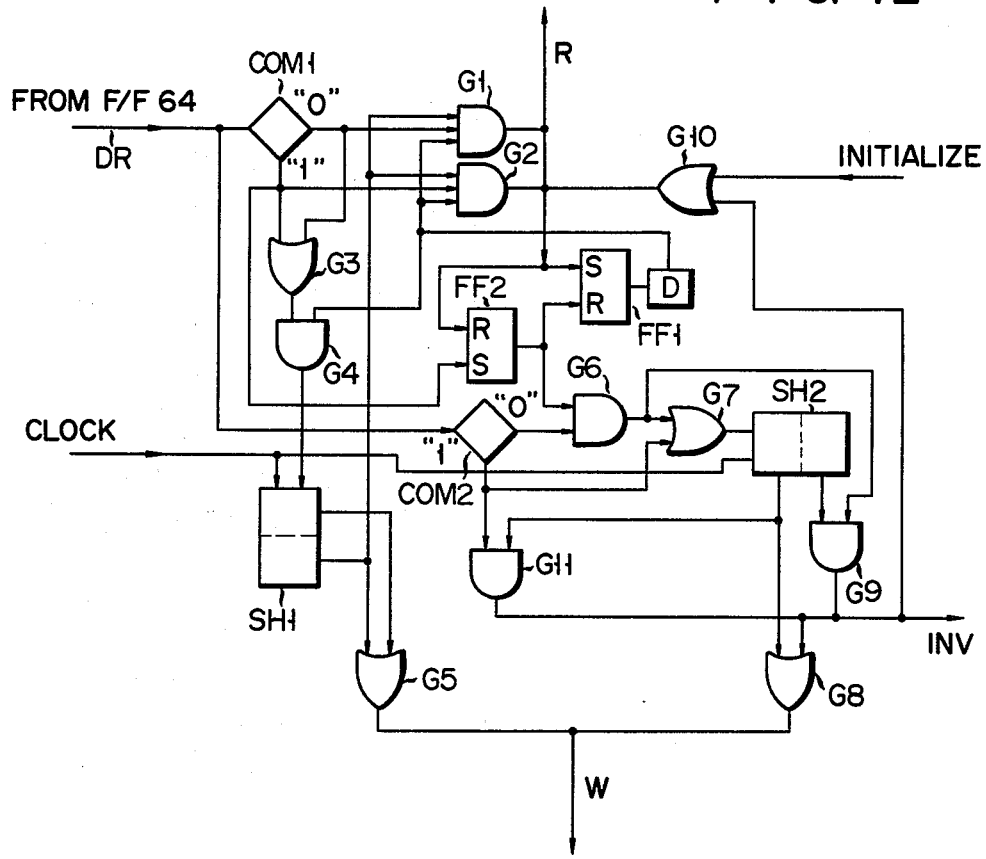
FIG. 12 shows a circuit diagram of the controller shown in FIG. 9.

Referring now to FIG. 12, there is shown an example of the controller 62 operable in the manner of the flow chart shown in FIG. 10.

In FIG. 2, when the initialize signal is supplied to an OR gate G10, the signal R is outputted from the OR gate G10. As the result, the signal $D_R$ is generated from the flip-flop 64. When the signal $D_R$ is "0" level, a comparator COM1 generates a signal at its 0-output terminal. The output signal of the comparator COM1 is supplied to an AND gate G1 and an OR gate G3 through an AND gate G4. The signal through the OR gate G3 is supplied to a shift register SH1 since the AND gate G4 receives a set signal from a RS flip-flop FF1. The shift register SH1 generates output pulses from its first and second stages. The output pulse of the shift register SH1 is supplied as the shift signal W to the output shift register 63 (FIG. 9) via an OR gate G5. The pulse from the second stage of the shift register SH1 also is supplied to the AND gate G1. In this time, since the AND gate G1 is supplied with the output signal of the COM1 and the set signal of the FF1, the signal R is produced from the AND gate G1 in response to the pulse of the second stage of the SH1. As well as the signal $D_R$ is "0" level, the above operations are repeated. When the signal $D_R$ is "1" level, the comparator COM1 generates at its 1-output terminal an output signal which is supplied to the shift register SH1 via the gates G3 and G4 and the set terminal of a RS flip-flop. The set signal of the FF2 resets the flip-flop FF1 and opens the AND gate G6. In this state, when a next signal $D_R$ of "0" level is supplied to the comparator COM2, the output signal from the 0-terminal of the COM2 is supplied to the shift register SH 2 via the AND gate G6 and the OR gate G7. As the result, the shift register SH2 generates in turn two pulses which are supplied to the output shift register 63 (FIG. 9) via the OR gate G8 and the AND gate G9, respectively. The pulse through the AND gate G9 is supplied as the signal R to the delay circuit 65 (FIG. 9) via the OR gate G10. The pulse through the AND gate is also supplied to the flip-flop circuits FF1 and FF2 to set the FF1 and reset the FF2. The other hand, when the signal $D_R$ is "1" level, the signal from the 1-terminal of the comparator COM2 is supplied to the AND gate G11 and the shift register SH2 via the OR gate G7.

The pulse from the first stage of the shift register SH2 is used as the signal W and the signal INV.

Figure 13:
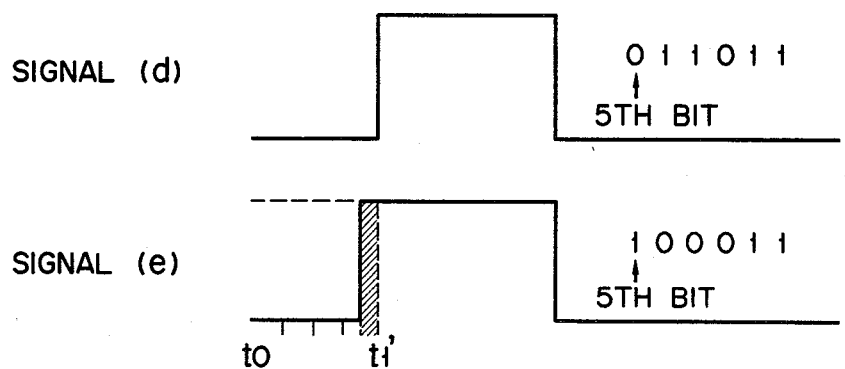
FIG. 13 shows wave forms of the signals corresponding to the head pattern data when the junction of the pattern divided is taken into account.

Turning now to FIG. 13, there are shown a couple of gate signal waveforms d and e when the connection of the IC pattern is taken into account. Before entering into the waveforms, description will be made of the joining of the IC pattern.

Generally, the scanning range of an electron beam must be set up within several mm length. On the other hand, the size of the pattern to be depicted is 10 cm$^2$. For this, the pattern is divided into a plurality of square or rectangular sections. In this case, if a pattern to be depicted extends over two or more sections divided, such the pattern is depicted being divided along the boundary line or lines.

For correctly coupling these divided patterns together, an object to be exposed is carefully and precisely positioned and further precisely positioned by using a laser interferometer in association with an electrical feedback system. This positioning manner may attain about 0.2μm of the accuracy of the positioning. The causes for the positioning error are: the unit of the laser measuring is quantitized at, for example, 0.08μ; the moving mechanism is possibly subjected to temperature variation; and the electron beam has inherently a position drift. For this, it is impossible to completely eliminate the error.

Figure 14:
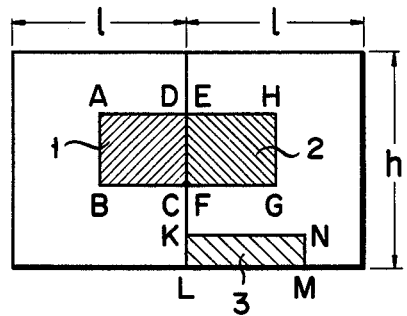
FIG. 14 shows an IC pattern in which divided pattern sections are certainly connected.

An example shown in FIG. 14 is that two divided sections are correctly coupled together. In this example, a single pattern ABHG is divided into two square sections ABCD and EFGH as designated by 1 and 2, respectively. And these two sections 1 and 2 are separately exposed and then coupled together. In the figure, a rectangular pattern KLMN designated by reference numeral 3 is not divided.

Figure 15:
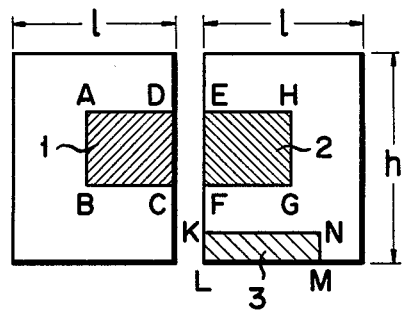
FIG. 15 shows an IC pattern in which divided pattern sections are disposed in a separate fashion.

In FIG. 15, two sections are positioned with a gap between them so that the pattern ABHG is disposed separately the patterns 1 and 2. Although an electron beam exposure apparatus is uded mainly to depict the pattern of LSI, the case of FIG. 15 is undesirable because it brings about disconnection in wiring. For avoiding this problem, there is a proposal to slightly largely depict all the patterns. This proposal, however, is insufficient to solve such the problem since the pattern disposed in the vicinity of the boundary between the divided sections is smaller than the central pattern.

In the present invention, a joining portion is employed to ensure the joining of the separated patterns. The principle of this will be described with reference to FIG. 16. In the figure, assume that an electron beam is scanned horizontally and that the scanning width 1 is 250μm and includes 250 bits representing black or white picture elements and the height h is approximately 10 cm. Reference numeral 4 designates a joining portion and numeral 5 the overlapped portion of the joining portion and the section 1.

Figure 16:
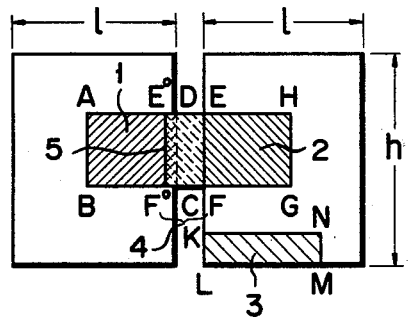
FIG. 16 shows an IC pattern with a joining portion.
Figure 17A:
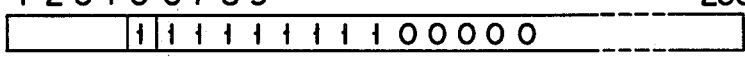
FIGS. 17A and 17B show formats of the pattern information having a joining data element.
Figure 17B:
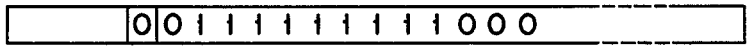

FIG. 17A shows a bit pattern representing the horizontal portion pattern including the section 2 shown in FIG. 16. In the bit pattern, 250 bits from the 6th to 255th bits correspond to the black or white picture elements of the horizontal pattern. The black picture element is represented by a binary "1" and the white picture element by a binary "0". The first bit denotes the condition for connecting between the section 1 and 2. In this case, the joining portion is black and thus represented by "1", as shown. FIG. 17B shows a bit pattern corresponding to the section 3 and, in this case, no connection presents so that the fifth bit is "0".

As shown in FIG. 17A, if the fifth bit is "1", the joining portion 4 denoted as EFF'E' is formed to connect the section 1 and 2.

The width of the joining portion 4 is not necessarily 1 bit. Preferably, it is as narrow as possible, so long as the accuracy of the overlapping permits it. Use of a gate circuit enables the width of the joining portion to be adjusted. For example, the width may be represented by 0.5 bit.

The gate signal wave forms d and e shown in FIG. 13 illustrate the case when the width of the joining portion is below 1 bit. As shown, the wave form d rises at t'1, i.e. after 3.5 clocks from $t_0$, with an intention to correctly couple a pattern in the nth frame (the nth depicting field) with the corresponding one in the (n-1)th frame, when the nth frame is depicted. When the first six bits in a line are black, even if the data from the fifth bit is either "011011" or "100011", the nth frame enjoys the same result. However, when the corresponding part of the (n-1)th frame is white, the code "011011" as shown in the wave form d is used. In this case, if the code "100011" as shown in the wave form e is used for the case when the corresponding part is black, both cases are distinguishable. In this manner, the joint between the divided patterns may be formed by using the gate signal wave form e with the result that the patterns in the (n-1)th and nth frames may be well jointed each other.

In the code format shown in FIG. 4, "1" and "0" may be inverted or the inverted code and the non-inverted code may be alternately disposed. Many other modifications may be permitted. For example, the code "11" for 4 may be assigned to other numerals, e.g. 6, and the code for 5 to numeral 7. A magnetic disc or drum may be used for the main memory 31 in FIG. 6 and a common type core memory for the high speed buffer 32. In this case, the memory speed is reduced but a large size of pattern may be processed. Having described a specific embodiment referring particularly to FIGS. 7 to 13, it is believed obvious that other modifications and variations of the invention are possible in the light of the above teachings.

The above embodiment has referred to the case where a line data compression rate is ½. This rate, however, can be set at a given value. For example, where the rate is set at ¼, each of "0"s included in the data code of the data compression code corresponds to four data bits. That is, the data code "00" represents eight data bits. Where, for example, ten consecutive data bits are included in a bit section, eight of these data bits are represented as a data code "00" and the remaining two data bits are represented by a remainder code. The remainder code can be determined, for example, as follows.

| remainder | remainder code |
|---|---|
| 0 | 00 |
| 1 | 01 |
| 2 | 10 |
| 3 | 11 |

Accordingly, the two data bits are coded as a remainder code "10". Between this remainder code "10" and the data code "00" is placed a partition code "1". As a result, the above ten consecutive data bits are coded as a data compression code "00110".

Further, where the line data compression rate is set at ⅛, each "0" of the data code corresponds to eight data bits and the remainder code can be determined as follows:

| remainder | remainder code |
|---|---|
| 0 | 000 |
| 1 | 001 |
| 2 | 010 |
| 3 | 011 |
| 4 | 100 |
| 5 | 101 |
| 6 | 110 |
| 7 | 111 |

In this way, the line data compression rate can be set at a given value.

In the embodiment mentioned above, the pattern data are compressed in respect of both directions of the line and width of the pattern data but the data compression may be performed in respect of the line direction only.

As described above, the present invention comprises a memory for storing the pattern data of one line to be scanned, and a buffer and decoder both of which are disposed between the memory and beam control means. The buffer is so designed that, when the pattern data is repetitive, the preceding pattern data are applied to the control means, through the decoder, without requesting new pattern data from the memory. The result is that the data transfer speed is effectively improved when viewed from the control means. A depicting speed of 16M bits/sec may be attained which by far exceeds the maximum depicting speed of the conventional raster scan type exposure apparatus. This results in realization of application of the radiant beam exposure apparatus to the direct depiction of IC pattern on a wafer.

What is claimed is:

1. A method for compressing pattern data for use in a radiant beam exposure apparatus depicting a specified pattern by means of numerous scanning lines comprising:
   a. preparing a plurality of pattern data trains which correspond respectively to a plurality of scanning lines and which are each comprised of at least one data-element group composed of consecutive data elements having the same contents, and
   b. coding said data-element group into a code corresponding to the number of the consecutive data elements.

2. A pattern data compression processing circuit according to claim 1, wherein said decoder means includes a shift register for storing the third pattern data train read from the storing means and a converter means for reading in turn data elements of the third pattern data train from said shift register to convert each of the third pattern data trains into the first pattern data trains in accordance with the contents of the data element thus read from said shift register.

3. A pattern data compression processing circuit according to claim 1, wherein said third pattern data train is provided with a series of binary "0"s corresponding to a numerical value obtained by subtraction of 2 from the remainder obtained by dividing by 2 the number of consecutive data elements of the same contents included in the second pattern data train, with a binary "1" denoting the compartment for one data-element group which elements have the same contents, and with a binary "0" or "1" representing the odd or even number of the data elements.

4. A pattern data compression processing circuit according to claim 1, wherein said first and second pattern data trains each include data elements denoting a binary "1" with respect to a black portion of the pattern to be depicted and data elements denoting a binary "0" with respect to a white portion of the pattern to be depicted.

5. A method for compressing and processing pattern data for use in a radiant beam exposure apparatus depicting a specified pattern by means of numerous scanning lines comprising:
- a preparing a plurality of pattern data trains which correspond respectively to a plurality of scanning lines and which are each comprised of at least one data-element group composed of consecutive data elements having the same contents;
- b coding said data-element group into a code corresponding to the number of consecutive data elements, thereby to obtain a coded pattern data train corresponding to each of the scanning lines;
- c storing in a storing means a plurality of coded pattern data trains corresponding to the whole pattern; and
- d decoding each of said coded pattern data trains read out from said storing means into the original pattern data trains.

6. A pattern data compression-processing circuit for use in a radiant beam exposure apparatus depicting a specified pattern by means of numerous scanning lines comprising:
- a. a pattern data coding means for converting a plurality of pattern data trains which correspond respectively to a plurality of scanning lines and which are each comprised of at least one data-element group composed of consecutive data elements having the same contents and for coding said data-element group into a code corresponding to the number of consecutive data elements thereby to obtain a coded pattern data train corresponding to each of the scanning lines;
- b. a storing means for storing a plurality of coded pattern data trains corresponding to the whole pattern which are obtained by said coding means;
- c. a decoder means for decoding each of the coded pattern data trains read out from said storing means into said original pattern data trains.

7. A pattern data compression-processing circuit according to claim 6 wherein said storing means comprises a main memory storing all the coded pattern data trains corresponding to the whole pattern and a buffering means including a plurality of annularly joined memory blocks each of which writes the coded pattern data train from said main memory and reads the coded pattern data train to said decoder means.

8. A pattern data compression processing circuit for use in a radiant beam exposure apparatus depicting a specified pattern by means of numerous scanning lines comprising:
- a. a pattern data coding means for converting a plurality of first pattern data trains which correspond respectively to a plurality of scanning lines depicting the same pattern and which are each comprised of numerous data elements, into a single second pattern data train including data representing the number of said first data trains and for coding at least one data element group which is indcluded in said second pattern data train and comprised of consecutive data elements having the same content, into a code corresponding to the number of consecutive data elements having the same content, thereby to obtain a third pattern data train corresponding to each of first data trains;
- b. a storing means for storing a plurality of said third pattern data trains corresponding to the whole pattern which are obtained by said coding means; and
- c. a decoder means for decoding each of the third pattern data trains read out from said storing means into said first pattern data trains.

9. A pattern data compression processing circuit according to claim 8 wherein said storing means comprises a main memory storing all the third pattern data trains corresponding to the whole pattern and a buffer circuit including a plurality of annularly joined memory blocks each writing one of the third pattern data trains from the main memory and reading it into the decoder means.

* * * * *